(12) United States Patent
Voegeli

(10) Patent No.: US 7,977,937 B2
(45) Date of Patent: Jul. 12, 2011

(54) GMR BIOSENSOR WITH ALIGNED MAGNETIC FIELD

(75) Inventor: Otto Voegeli, Morgan Hill, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 320 days.

(21) Appl. No.: 12/290,701

(22) Filed: Nov. 3, 2008

(65) Prior Publication Data

US 2010/0109657 A1  May 6, 2010

(51) Int. Cl.
*G01N 27/72* (2006.01)
(52) U.S. Cl. .................................................. 324/228
(58) Field of Classification Search ............. 324/207.26, 324/207.15, 207, 21, 207.29, 67, 300–322, 324/228
See application file for complete search history.

(56) References Cited

U.S. PATENT DOCUMENTS

| | | | |
|---|---|---|---|
| 5,981,297 A | 11/1999 | Baselt | |
| 6,714,390 B2* | 3/2004 | Terada et al. | 360/324.12 |
| 7,250,759 B2 | 7/2007 | Kahlman | |
| 7,508,200 B2* | 3/2009 | Kahlman et al. | 324/225 |
| 2002/0172840 A1 | 11/2002 | Terada et al. | |
| 2006/0291108 A1 | 12/2006 | Sbiaa et al. | |
| 2007/0290683 A1* | 12/2007 | Ikeda et al. | 324/260 |
| 2008/0129286 A1 | 6/2008 | Kahlman et al. | |
| 2008/0218157 A1 | 9/2008 | Tondra et al. | |

OTHER PUBLICATIONS

PCT/US 09/05707 International Search Report, Dec. 2, 2009, Magic Technologies, Inc.

* cited by examiner

*Primary Examiner* — Ha Tran T Nguyen
*Assistant Examiner* — Trung Q Nguyen
(74) *Attorney, Agent, or Firm* — Saile Ackerman LLC; Stephen B. Ackerman

(57) ABSTRACT

A planar array of GMR or TMR sensor elements with planar free and pinned layers is used as the basis of a sensor for detecting the presence of small magnetized particles. In particular, the sensor is used for detecting the presence of magnetized particles bonded to biological molecules that are themselves bonded to a substrate. The magnetized particles on the molecules are detected by the sensors as a result of the interaction between the stray fields of the particles and the magnetic configuration of the sensors. By forming a co-planar layer of soft magnetic material over the sensor or its array, the external field used to magnetize the particles is self-aligned perpendicularly to the sensor plane whereby it does not interfere with the stray fields of the particles.

18 Claims, 4 Drawing Sheets

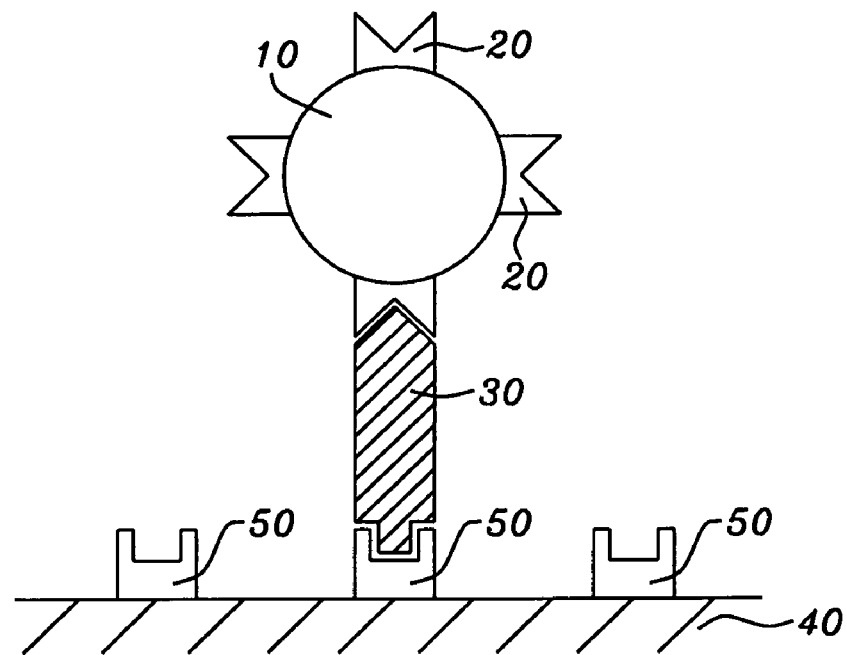
FIG. 1 - Prior Art
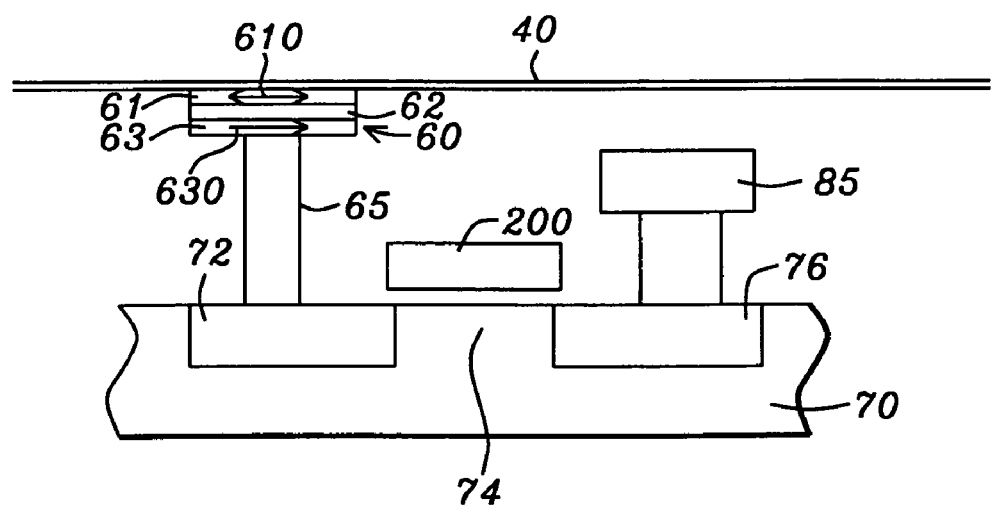
FIG. 2 - Prior Art

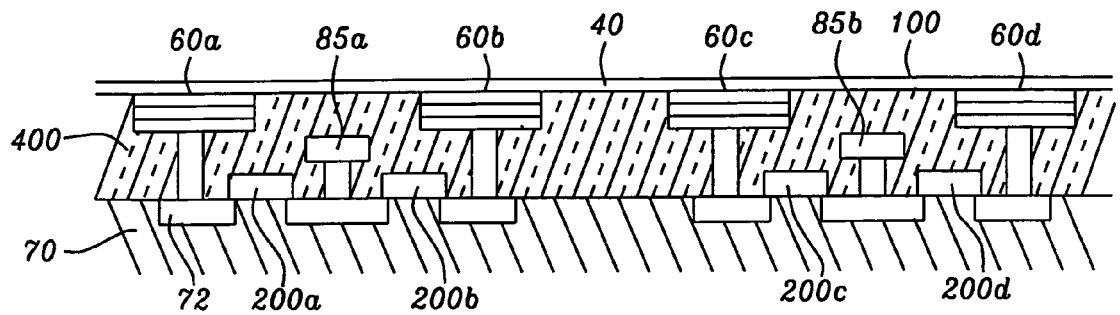
FIG. 3 – Prior Art
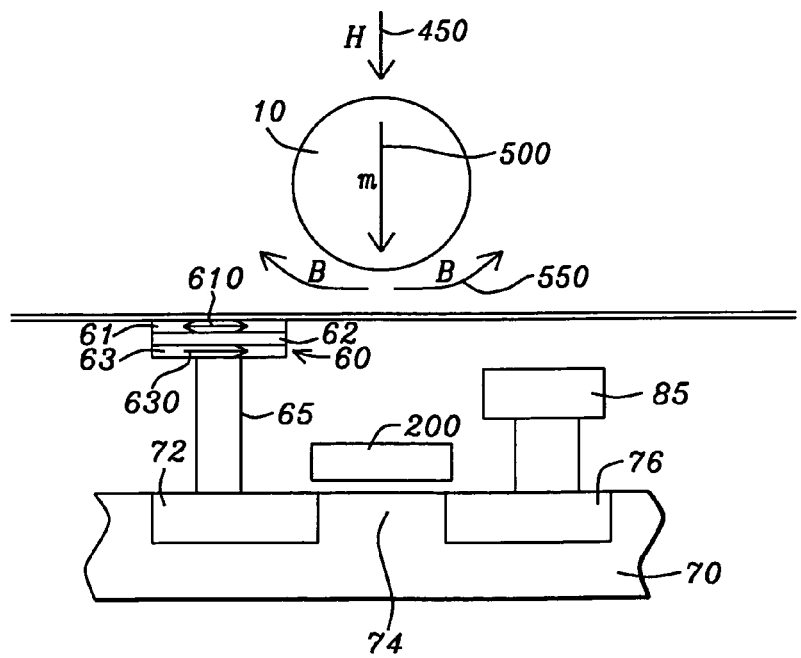
FIG. 4 – Prior Art

GMR BIOSENSOR WITH ALIGNED MAGNETIC FIELD

BACKGROUND OF THE INVENTION

1. Field of the Invention

This invention relates to a magnetic sensor for the detection of small particles magnetized by an external magnetic field, particularly to such a sensor that utilizes an external field applied in a direction perpendicular to the sensor plane.

2. Description of the Related Art

Magnetic sensors have been shown as capable of detecting the presence of specific chemical and biological molecules when such molecules are a part of a fluid mixture that includes many other types of molecules. The method underlying such magnetic detection of molecules requires that labels, comprising small magnetic (or magnetizable) particles, be attached to the specific molecules in the mixture that are of interest. The magnetic particles used as such labels may have ferromagnetic, ferrimagnetic, paramagnetic or superparamagnetic properties. Particles with ferromagnetic or ferrimagnetic characteristics have intrinsic magnetic moments, whereas particles with paramagnetic or superparamagnetic properties acquire an induced magnetic moment when placed in an external magnetic field. Irrespective of the magnetic characteristics of the label, the particle's detection system typically includes a magnetic field which serves to either magnetize or orient the particles. The magnetic field may be produced by an external source, such as a permanent magnet or an electromagnet, or it may be generated locally using an electrical current flowing through a conductor of the appropriate geometry that is an integrated component of the sensor configuration. In either case, the local magnetic stray field of the attached particle would be used to generate a detectable signal from the magnetic sensor. The present invention will be concerned with particles that require an applied magnetic field to magnetize them so that they will produce a local stray field suitable for detection by the sensor apparatus. In particular, the invention is concerned with embodiments where the magnetic sensing apparatus utilizes the in-plane (i.e., the plane of the substrate confining the labeled molecules) component of this stray field to produce a signal indicative of the presence of the magnetic label particle The magnetizable particles used as labels (to be called, simply, "magnetic labels" in the following) are attached to molecules by coating them with a chemical substance or biological species that binds to those molecules. Then, a surface is provided on which there has been affixed receptor sites (e.g., specific molecules) to which only the molecules of interest will bond. After the mixture has been in contact with the surface so that the molecules of interest have bonded to the receptor sites, the surface is flushed in some manner to remove all unbonded molecules. Because the bonded target molecules are equipped with the attached magnetic labels, it is only necessary to detect (and count) the magnetic labels to be able, at the same time, to assess the number of captured target molecules. Thus, the magnetic particles are simply "labels," which can be easily detected and counted once the molecules of interest have been captured by chemical bonding to the receptor sites on the surface. The technological issue, then, is to provide an effective method of detecting these small magnetic labels, since their detection is tantamount to detection of the target molecules.

One prior art method of detecting small magnetic labels affixed to molecules bonded to receptor sites is to position a means of sensing a magnetic field beneath the receptor sites. Such a sensing means could be a device that makes use of the magneto-resistive effect. These devices are already employed as read-heads to sense local fields from a magnetic recording medium. In other configurations, they are used to sense the local fields produced by an MRAM storage element in a magnetic memory array. In a preferred embodiment of this invention, the sensing device can be positioned beneath the substrate surface on which the receptor sites have been placed.

FIG. 1 is a highly schematic diagram (typical of the prior art methodology) showing a magnetic label (10) covered with receptor sites (20), with four identical sites being shown for exemplary purposes. Each of these identical sites is specific to bonding with a target molecule (30) (shown shaded) which is shown as already being bonded to one of the sites. Note that "bonding" is schematically indicated by the insertion of a shaped end of the molecule (30) into a correspondingly shaped opening into the receptor site. A substrate (40) is covered with another set of identical receptor sites (50) that are also specific to target molecule (30) and those sites may, in general, be different from the sites that bond the magnetic label to the molecule. The target molecule (30) is also shown bonded, at its other end, to one of the receptor sites (50) on the surface. Thus, the magnetic label (10), is held above the substrate (40), by means of the molecule (30) that serves as a doubly bonded link.

FIG. 2 schematically shows a prior art GMR sensor (60) and associated circuitry that is positioned beneath the substrate (40) of FIG. 1. Such prior art is also taught by Baselt (U.S. Pat. No. 5,981,297). Improvements on such prior art, which are not shown here, are taught by Shiaa et al. (US Published Patent Application 2006/0291108).

For clarity, the receptor sites on the substrate shown in FIG. 1 are not shown in FIG. 2. As shown schematically in the cross-sectional view of FIG. 2, the prior art GMR sensor (60) is preferably in the form of a laminated thin film stripe that includes a magnetically free layer (61) and a magnetically pinned layer (63) separated by a thin, non-magnetic but electrically conducting spacer layer (62). The pinned layer is shown with a fixed magnetic moment (a single ended arrow (630)) and the free layer is shown with a variable moment (double ended arrow (610)). It should be noted that the GMR structure (60) could be replaced by a TMR (tunneling magneto resistive) element, in which case layer (62) would be a thin dielectric layer rather than a thin conducting layer. The important feature in either the GMR or TMR case is that the sensor changes its resistance in accord with the presence of an external magnetic stray field generated by the magnetic label as will be discussed below. For realism, some additional circuit elements are schematically indicated, such as source (72), drain (76) and gate (74) regions of an accessing transistor formed in a solid-state (e.g., Si) substrate (70) that would allow the sensor (60) to be selected for measuring purposes, through a conducting via (65), by means of currents in conducting lines (200) and (85).

The properties of the sensor (either GMR or TMR) causes it to act essentially as a resistor whose resistance depends on the relative orientation of the magnetic moments of the free (610) and pinned (630) layers, with a low resistance value being associated with alignment of the moments and a high value being associated with anti-alignment.

Referring to FIG. 3, there is shown a schematic illustration of a portion of an array of prior art sensors of the type shown singly in FIG. 2, in which pairs (two pairs being shown) of sensors (60a), (60b) and (60c), (60d) are formed beneath an upper substrate (40) on which molecules will be bound for identification purposes. The sensors are accessed by current carrying lines (200a), (200b) (85a) and (200c), (200d), (85b).

Typically, the sensors will be separated by insulation layers (400) and will be formed on a substrate (70) that is suitable for the fabrication of the various types of solid-state electronic circuitry, such as a region forming an accessing transistor (72). This array is highly schematic and is shown for exemplary purposes only. Other configurations could equally well link sensors of the type shown in FIG. 2 into a multi-sensor array.

Referring now to schematic FIG. 4, there is shown again the single prior art sensor of FIG. 2, now with a magnetic label (10) positioned above it. It is understood that the label is attached by a molecule (not shown) to a receptor site (not shown) on the upper substrate (40) as shown in FIG. 1. An applied magnetic field H (450), which could be static or dynamic, is represented by a single vertical arrow directed downward and substantially perpendicular to the substrate (40). The magnetic field, H, has induced a magnetic moment, m, (500) in the magnetic label (10) that is substantially co-directional with H. The magnetic moment generates a magnetic stray field, B, (550) typically of a magnetic dipole shape, that is here schematically represented by curved field lines (550) external to the particle. As indicated in the drawing, stray field B has a component that is parallel to the substrate plane (40) (hereinafter referred to as an "in-plane" component) and is also parallel to the free layer (61) of the sensor (60). It is this in-plane component that is responsible for producing variations (e.g., vector rotations) of the magnetic moment (610) of the sensor's free layer and, thereby, producing a measurable change in the resistance of the sensor that allows the presence of the magnetic label to be detected. Although the applied magnetic field, H, may be substantially more intense than B, its presence does not affect the free layer magnetic moment if it is precisely perpendicular to the plane of the free layer. If, however, the applied magnetic field, H, were not perpendicular, its in-plane component could significantly perturb the effects of B, and thereby adversely affect the accuracy of the sensor. The presence of an in-plane component can also adversely affect the signal-to-noise ratio of such a sensor, as is noted by Kahlman et al. (U.S. Pat. No. 7,250,759) who also teaches methods for changing the external magnetic field and, in combination with noise canceling circuitry, thereby improving the performance of a sensor. It is to detecting the presence of magnetic labels while mitigating the adverse effects of in-plane components of an applied magnetic field that this invention is directed, as indicated in the objects set forth below.

SUMMARY OF THE INVENTION

A first object of this invention is to provide a method of determining the presence or absence of small magnetized particles, hereinafter called magnetic labels.

A second object of this invention is to provide such a method that detects the aforementioned magnetic labels when they are bonded to chemical or biological molecules.

A third object of the present invention is to provide such a method that uses the magneto resistive properties of a GMR or TMR sensor to detect the presence of a small magnetic label by means of the stray field, B, of its magnetic moment that is induced by an applied magnetic field, H.

A fourth object of the present invention is to provide a GMR or TMR sensor and an array of such sensors to be used in detecting the presence of small magnetic labels, wherein the response of the sensor to the induced magnetic stray field, B, of the small magnetic labels is not adversely affected by an in-plane component of the applied magnetic field, H, that produces the induced magnetic field B.

In achieving the above stated objects, the present invention addresses the fact that for an applied magnetic field, H, to be perpendicular to the substrate (i.e., to have no in-plane component), as shown by the arrow (450) in FIG. 4, it would have to be perpendicular globally, that is, over the entire region beneath which sensors are positioned. Producing and maintaining such a globally perpendicular field would be extremely difficult, because such magnetic fields, be they produced by permanent magnets or electromagnets, will naturally diverge. Thus, to avoid the effects of field line divergence in the region of the sensor array, the source of the field would have to be significantly larger than the size of the array. Such a source would be both expensive to fabricate and highly consumptive of power. The present invention will, therefore, address the problem of maintaining a perpendicular magnetic field by a process that globally self-aligns the applied magnetic field so as to maintain perpendicularity with the sensor substrate while doing so in a simple manner that does not require changing the way in which the field itself is produced.

Thus, the objects of the present invention as set forth above will be achieved by a GMR or TMR based sensor design, utilizing a planar array of GMR or TMR sensor elements in which there is an additional co-planar and co-extensive layer of "soft" (low coercivity) magnetic material, called herein a "keeper layer," formed, for example, on the same substrate as the array of sensor elements. Because of its low coercivity, the tangential component of H within this layer will be essentially zero, yet the stray field, B, of the label will be substantially unaffected at the position of the sensor. It is therefore desirable that:

a) the label be close enough to the sensor that the full magnitude of its stray field be felt;

b) that the keeper layer be sufficiently distant (i.e., vertically separated) from the label that it does not shunt or distort its stray field B;

c) that the spacing between the keeper layer and the sensor array be small compared to the size of the array and;

d) that the keeper layer be at least co-extensive with the array, i.e., that the array be entirely located within the lateral extent of the region covered by the keeper layer.

Referring to schematic FIG. 5, there are shown three possible configurations of a label (10), a sensor array (40) and a keeper layer (100). In each case the keeper layer or layers are parallel to the plane of the sensor. In each case the keeper layer is at least coextensive with the sensor, meaning that its lateral boundaries extend beyond the lateral boundaries of the sensor. It is also noted that the sensor itself can be any planar sensor device that is sensitive to an external magnetic field that has an in-plane component. In general, appropriate sensors would include sensors having magnetic configurations that can be affected by external magnetic fields and that have measurable electrical impedances that vary as a function of their magnetic configurations. In the preferred embodiments to be set forth below, we will describe GMR or TMR sensors whose magnetic configurations are defined by the relative magnetization directions of plane, parallel magnetic layers and whose resistance changes as a function of the angle between those directions.

In FIG. 5a, the label (10) and the sensor (40) are both positioned above the keeper layer (100). The keeper layer (100) is shown as being larger in lateral extent than the sensor (40). In FIG. 5b, the keeper layer (100) is shown as positioned above the magnetic label (10) and the sensor (40) and, again, the label is larger in lateral extent than the sensor. Finally, in FIG. 5c, the label (10) and sensor (40) are shown as sandwiched between two substantially parallel keeper layers, (100a) and (100b). FIG. 5c also shows a set of exemplary field lines (460) that are curved outside the region of the keeper layers, but have been globally self-aligned between the keeper layers to have no in-plane component relative to the plane of the sensor array. These field lines are produced by appropriate magnets, either permanent magnets, electromagnets or simply current carrying wires or leads.

Because of the positioning of the label and the sensor array relative to the keeper layers, the approximately dipolar B field (550) of the label (10) is not affected at the position of the sensor array (40). Although the keeper layer can be positioned over (i.e., on top of) the sensor array (as in FIG. 5b) or below the array (FIG. 5a), where it could be placed on the bottom surface of a thin substrate on which the sensor array is formed (see FIG. 6), positioning two keeper layers, as a sandwich: (keeper/sensor/keeper), as in FIG. 5c, would provide the desired field orientation to an even greater degree.

BRIEF DESCRIPTION OF THE DRAWINGS

The objects, features, and advantages of the present invention are understood within the context of the Description of the Preferred Embodiment as set forth below. The Description of the Preferred Embodiment is understood within the context of the accompanying figures, wherein:

FIG. 1 (prior art) is a schematic representation of a magnetic particle bonded to a target molecule and the target molecule bonded to a receptor site on a planar substrate.

FIG. 2 (prior art) is a schematic cross-sectional representation of a GMR sensor such as would be positioned beneath the substrate of FIG. 1.

FIG. 3 (prior art) is a schematic representation of a planar array of sensors such as shown singly in FIG. 2.

FIG. 4 (prior art) is a schematic side view of the prior art sensor of FIG. 2 with a magnetized particle bonded above it, showing the external B field of the particle in the plane of the sensor.

DESCRIPTION OF THE PREFERRED EMBODIMENTS

Although any planar sensor whose electrical impedance is affected by an external impinging magnetic field that has an in-plane component can be used to meet the objects of this invention, a preferred embodiment of the present invention uses a planar laminated GMR or TMR based sensor (i.e., an array of GMR or TMR cell elements formed on a planar substrate). This sensor will be used for detecting the presence of small magnetized particles (also called magnetic labels), typically bonded to chemical molecules and thereby affixed to the sensor surface. The GMR or TMR based planar sensor, by virtue of a proximate, parallel and at least co-extensive layer of soft (low coercivity, high permeability) magnetic material, called a keeper layer, formed closely adjacent to the array, for example, upon it or beneath it or both, is then not adversely affected by an in-plane component of an external static magnetic field that is used to induce a magnetic moment in the magnetic particles. The layer(s) of soft magnetic material self-aligns the external magnetic field so that it impinges perpendicularly on the planar array. The elimination, thereby, of the adverse affects of any non-perpendicular component is achieved by the presence of the keeper layer (or layers) that is formed as a parallel planar layer adjacent to the sensor and at least co-extensive with it.

Figure 5A:
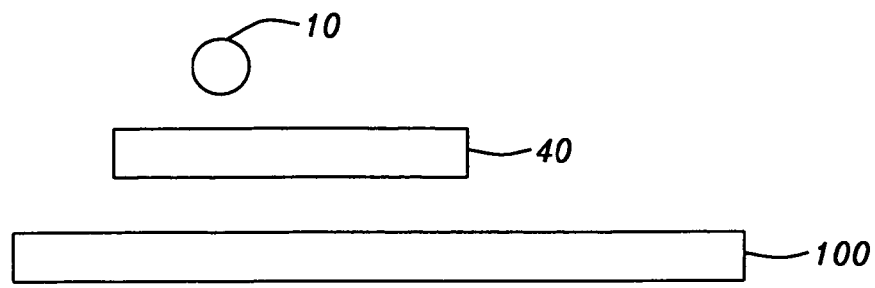
FIGS. 5a, 5b and 5c are schematic illustrations showing 3 possible positions of a keeper layer or layers relative to a magnetic label and a sensor.
Figure 5B:
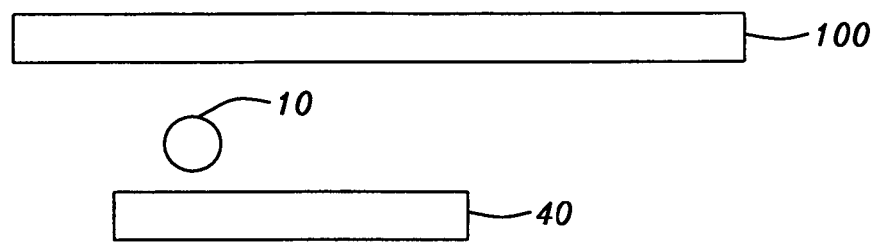
Figure 5C:
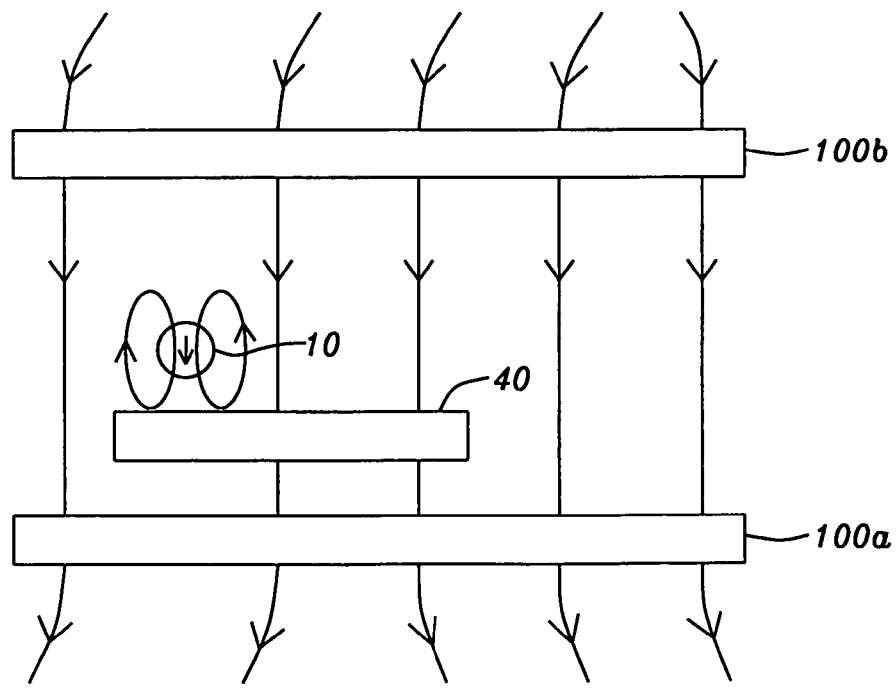
Figure 6:
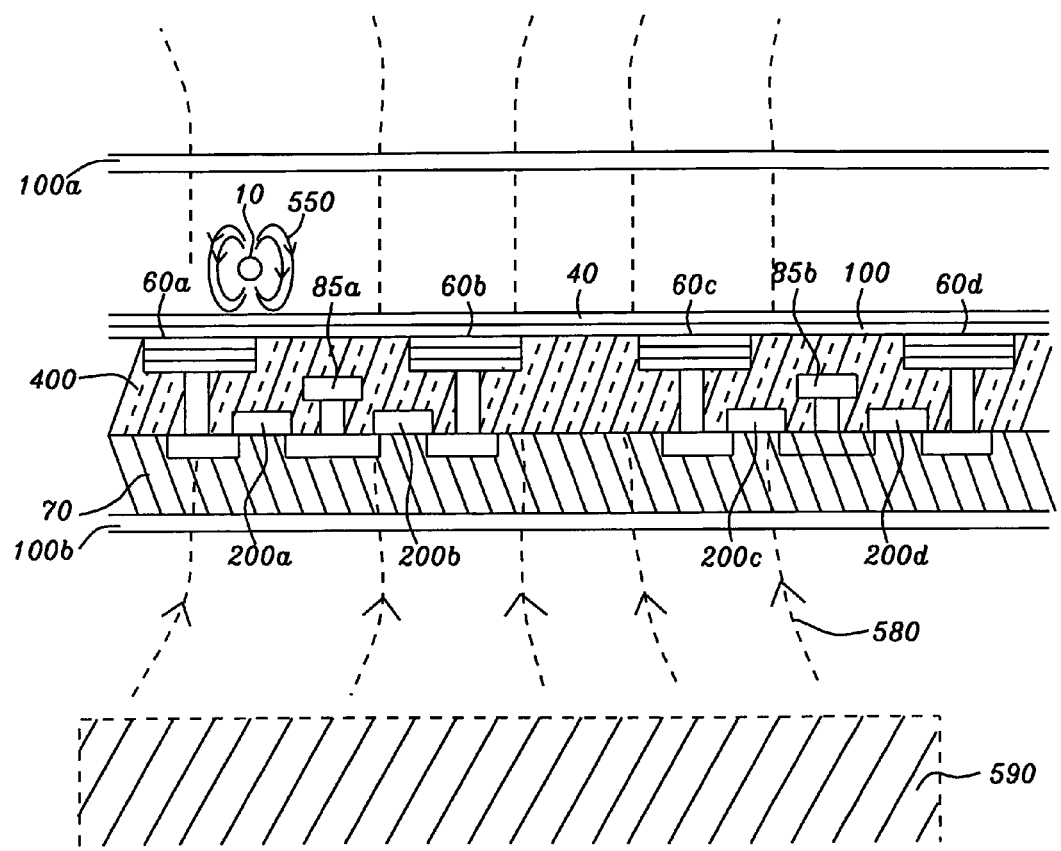
FIG. 6 is a cross-sectional schematic view of a sensor array like that of FIG. 3, showing the addition of two soft magnetic keeper layers that sandwich the sensor.

Referring to FIG. 6, there is shown, schematically, one embodiment of the present invention, wherein there are formed two parallel planar keeper layers, one above and one below a GMR or TMR sensor array with both layers being parallel to the planar configuration (i.e., to the sensor substrate and to the magnetic layers of the individual sensor elements) of the sensor array such as illustrated in FIG. 3. Such an embodiment of the invention has been constructed and shown to render the orientation of an external magnetic field non-critical. Prior to the formation of the keeper layers, the orientation of the external magnetic field, even careful adjustment of the external magnetic field did not eliminate proper sensor operation. It is to be noted that there is also an embodiment in which only a single keeper layer is formed above the sensor. Such an embodiment would correspond to the illustration in FIG. 6 where keeper layer (100a) were not present. Similarly, there is an embodiment in which a single keeper layer is formed beneath the sensor array, such as would be the case if keeper layer (100b) were removed and keeper layer (100a) were present. These further embodiments correspond to the more schematic illustrations in FIG. 5a and FIG. 5b.

Referring now to FIG. 6, there is shown a sensor array similar to that of FIG. 3 with the addition of two keeper layers (100a) and (100b) positioned above and below the sensors (60a), (60b), (60c) and (60d) and parallel to an upper substrate (40) to which molecules (10) will be bound for identification purposes. Each of the keeper layers can be formed of any soft magnetic material, including alloys and ferrites, which are well known in the art. An exemplary magnetic label (10) is shown adjacent to sensor element (60a). Stray field lines (550) are shown in an approximately dipolar form issuing from the magnetized label, with the field lines exhibiting in-plane components tangent to the substrate (40). A highly schematic magnet pole (590) is shown producing field lines (580) that are generally curved below keeper layer (100b) and above keeper layer (100a). The lines are perpendicular to the sensor substrate (40) in the region between the keeper layers, however, so they produce no in-plane component to adversely affect the detection of the magnetic label (10).

It should be clear to those skilled in the art, that either one of the two keeper layers in FIG. 6 can be removed, to form a sensor in which there is a single co-planar and co-extensive keeper layer, either above the GMR or TMR array or below the array.

The keeper layer should be of sufficient thickness so as not to be magnetically saturated by the in-plane component of the applied magnetic field H. If we denote the thickness of the layer by t, the lateral expanse of the layer by w, the saturation magnetization of the layer by M and the in-plane component of the applied field by $H_t$, then the condition to be satisfied by t is:

$$t/w \geq H_t/(4\pi M)$$

Thus, the minimal keeper thickness is proportional to the expected value of the in-plane component of the applied magnetic field H and to the width of the keeper layer, which must exceed the size of the sensor array. For typical soft magnetic keeper material, such as permalloy, $4\pi M$ is approximately 10,000. A thick keeper layer example: w=1 cm (very large sensor array) and a 10 Oe in-plane field would require a minimum keeper thickness, t=10 microns. A thin keeper example, w=10 microns (up to approximately 100 sensors) and a 10 Oe in-plane field, requires a minimal keeper thickness t=0.01 microns. In terms of practical implementation, the 10 micron keeper layer might be advantageously deposited on the bottom of the sensor substrate (see, e.g. layer 100b in FIG. 6), while a thinner 0.01 micron keeper layer can be integrated into the sensor assembly itself.

As is finally understood by a person skilled in the art, the preferred embodiments of the present invention are illustrative of the present invention rather than limiting of the present invention. Revisions and modifications may be made to methods, materials, structures and dimensions employed in forming and providing a sensor for detecting magnetized particles, that is not adversely affected by an in-plane component of an external static magnetic field used to induce a magnetic moment in those magnetized particles, while still forming and providing such a sensor and its method of formation in accord with the spirit and scope of the present invention as defined by the appended claims.

What is claimed is:

1. method for detecting the presence of a small magnetized particle proximate to a planar sensor having a magnetic configuration, wherein the magnetization of said small magnetized particle is accomplished by subjecting said particle to an applied magnetic field, wherein said magnetic field has all in-plane field components in the plane of said sensor substantially eliminated, wherein said applied magnetic field produces a magnetic stray field in the vicinity of said particle, wherein said stray field has an in-plane component and wherein said magnetic configuration of said sensor is affected by said in-plane component of said stray field and wherein said detecting of said presence of said small magnetized particle is accomplished by monitoring said affected magnetic configuration of said sensor, said method comprising said substantial elimination of said in-plane component of said applied field by positioning at least one planar magnetic keeper layer proximate to, at least coextensive with and parallel to said sensor.

2. The method of claim 1 wherein said at least one planar magnetic keeper layer self-aligns said applied field in a perpendicular direction relative to the plane of said planar sensor whereby said in-plane component of said applied field is eliminated and does not affect said magnetic configuration of said sensor.

3. The method of claim 2 wherein said at least one planar magnetic keeper layer is formed as a layer of low coercivity magnetic material.

4. The method of claim 1 wherein said applied field is produced by a magnet having a first pole piece located above said at least one planar magnetic keeper layer and a second pole piece located below said planar sensor.

5. The method of claim 1 wherein said applied field is produced by an electrical current in a conductor located proximate to said magnetized particle.

6. The method of claim 1 wherein said sensor comprises a magnetic reference layer having a fixed magnetization and a magnetic free layer having a magnetization responsive to said in-plane component of said stray field and wherein said sensor has an electrical impedance and wherein said monitoring comprises a measurement of changes in said electrical impedance of said sensor.

7. The method of claim 1 wherein said at least one keeper layer has a lateral extent such that the lateral boundaries of said at least one keeper layer are located substantially beyond the lateral boundaries of said sensor.

8. The method of claim 1 wherein there is one keeper layer and it is located above said magnetized particle.

9. The method of claim 1 wherein there is one keeper layer and it is located beneath said sensor.

10. The method of claim 1 wherein there are two keeper layers and said sensor and magnetized particle are located between said keeper layers.

11. A sensor for detecting the presence of small particles magnetized by an external magnetic field comprising:
   a planar array of sensor elements, said elements having a magnetic configuration that can be affected by an external magnetic field and said elements having an impedance that is sensitive to said magnetic configuration, wherein said array is formed on a lower substrate;
   an upper substrate formed over said planar array, said substrate having sites to which said small particles can be bound;
   at least one planar keeper layer of soft magnetic material formed closely adjacent to, parallel to and at least co-extensive with said planar array; whereby
   an external source of a static magnetic field will magnetize said small particles and produce resulting stray fields having in-plane components in the plane of said planar array; and
   whereby said at least one keeper layer aligns said static magnetic field in a direction substantially perpendicular to the plane of said planar array.

12. The sensor of claim 11 wherein said at least one keeper layer is formed beneath said upper substrate.

13. The sensor of claim 11 wherein said at least one keeper layer is formed above said upper substrate.

14. The sensor of claim 11 wherein there are two, vertically separated, parallel keeper layers and said sensor array is formed between them.

15. The sensor of claim 11 further including a source of an external magnetic field to magnetize said small magnetic particles.

16. The sensor of claim 11 wherein, if said small magnetic particle is magnetized:
   a) said small particle is close enough to a sensor element that the full magnitude of its stray field is felt thereat;
   b) said at least one keeper layer is sufficiently distant from said small particle that it does not shunt or distort said stray field;
   c) a vertical spacing between said at least one keeper layer and the sensor array is small compared to a lateral extent of said array and;
   d) said at least one keeper layer is at least co-extensive with said array.

17. The sensor of claim 11 wherein said at least one keeper layer has a thickness t, a lateral width w and a saturation magnetization M and wherein an applied field having an in-plane component in the plane of said planar sensor, $H_t$, in the absence of said at least one keeper layer will have that in-plane component eliminated if $t/w \geq H_t/(4\pi M)$.

18. The sensor of claim 1 wherein said at least one keeper layer is formed of a ferrite or an alloy of Co, Fe and Ni.

* * * * *